US008283954B2

(12) United States Patent
Chao et al.

(10) Patent No.: US 8,283,954 B2
(45) Date of Patent: Oct. 9, 2012

(54) RSMRST SIGNAL OUTPUT CIRCUIT

(75) Inventors: Hong-Wen Chao, New Taipei (TW); San-Yuan Chuang, New Taipei (TW); Mao-Shun Hsi, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 41 days.

(21) Appl. No.: 13/095,865

(22) Filed: Apr. 28, 2011

(65) Prior Publication Data

US 2012/0092045 A1  Apr. 19, 2012

(51) Int. Cl.
*H03L 7/00* (2006.01)
(52) U.S. Cl. .............................. 327/143; 327/80; 327/81
(58) Field of Classification Search .................... 327/77, 327/80, 81, 142, 143, 198
See application file for complete search history.

(56) References Cited

U.S. PATENT DOCUMENTS

| 2006/0044028 A1* | 3/2006 | Bhattacharya et al. ........ 327/143 |
| 2009/0174443 A1* | 7/2009 | Li et al. ......................... 327/143 |

\* cited by examiner

*Primary Examiner* — Long Nguyen
(74) *Attorney, Agent, or Firm* — Altis Law Group, Inc.

(57) ABSTRACT

A resume and reset (RSMRST) signal output circuit, for outputting a low level voltage RSMRST signal, includes a first switch circuit, a delay circuit, and a second switch circuit. The first switch circuit receives a first voltage signal and converts the first voltage signal to a second voltage signal. The delay circuit is charged by the second voltage signal and outputs the second voltage signal it is when fully charged. The second switch circuit receives the second voltage signal and outputs the low level voltage RSMRST signal. The delay circuit is charged during a first state and discharged during a second state.

15 Claims, 2 Drawing Sheets

RSMRST SIGNAL OUTPUT CIRCUIT

BACKGROUND

1. Technical Field

The disclosure generally relates to a signal output circuit, and especially to a resume and reset (RSMRST) signal output circuit output a low level voltage RSMRST signal in computer systems.

2. Description of Related Art

When a computer system is awakened from an Advanced Configuration and Power Interface (ACPI) sleep state S4, components on a motherboard of the computer system are powered up. During the power up sequence of the motherboard, there is a plurality of signals (e.g., RSMRST signal, +3.3V_AUX voltage signal) in the computer system that should meet a required signal timing sequence. The RSMRST signal is generated from a south bridge chip and sent to a Super I/O chip of the computer system. The +3.3V_AUX voltage signal is generated from a DC power supply and sent to graphics acceleration cards, net cards and other cards on the motherboard. The RSMRST signal is controlled by the +3.3V_AUX voltage signal. The +3.3V_AUX voltage signal charges a RC filter circuit to output the RSMRST signal when the RC filter circuit is fully charged. A typical delay circuit outputs a high level voltage RSMRST signal when the RC filter circuit is fully charged. If the typical delay circuit is used to drive peripheral devices which are activated at low level voltage RSMRST signal, a power up failure will occur, and the computer system cannot return to state S0, (the operating state), from the sleep state S4.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
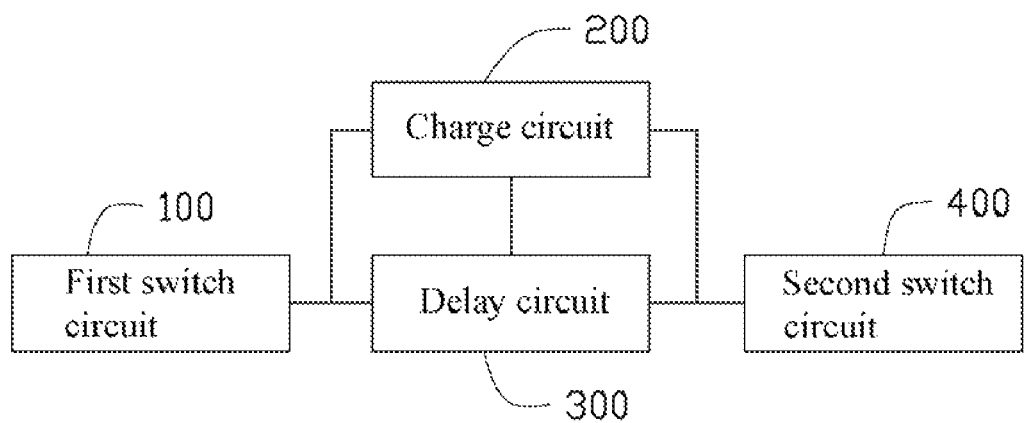
FIG. 1 is a block diagram of an embodiment of a RSMRST signal output circuit.

Referring to FIG. 1, an embodiment of a resume and reset (RSMRST) signal output circuit for outputting a low level voltage RSMRST signal includes a first switch circuit 100, a charge circuit 200, a delay circuit 300, and a second switch circuit 400. The first switch circuit 100 is configured to receive a low level voltage first voltage signal and convert the first voltage signal to a second voltage signal. The delay circuit 300 is configured to be charged by the second voltage signal via the charge circuit 200 and output the second voltage signal once fully charged. When the first switch circuit 100 receives a high level voltage first voltage signal, the delay circuit 300 is configured to be discharged by the first switch circuit 100. The second switch circuit 400 is configured to receive the second voltage signal and output the low level voltage RSMRST signal.

Figure 2:
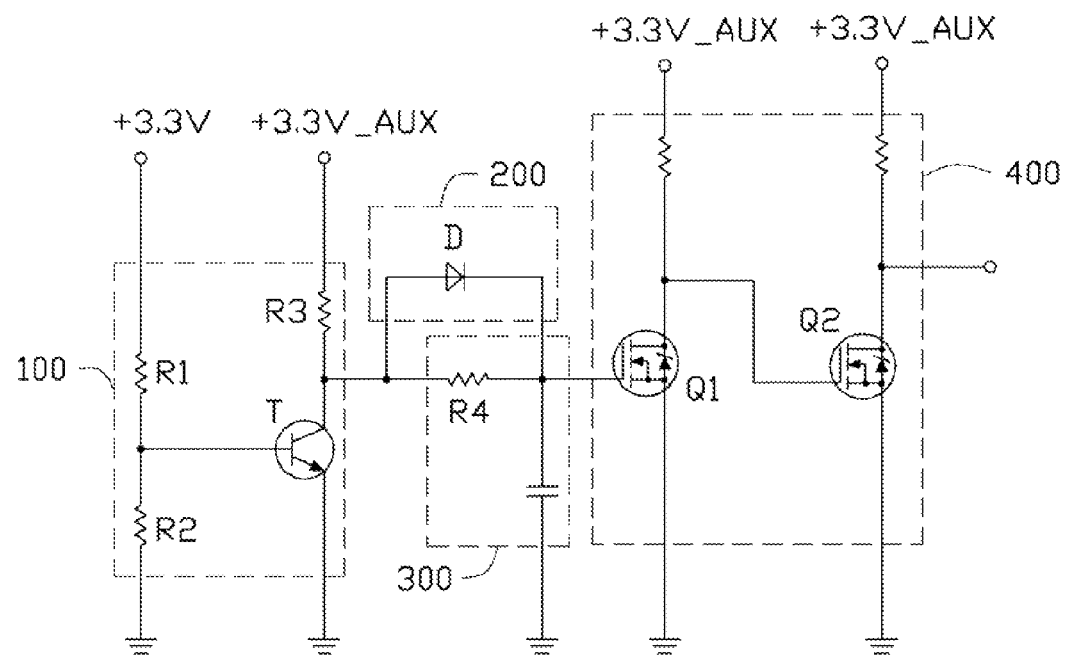
FIG. 2 is a circuit view of the RSMRST signal output circuit of FIG. 1.

Referring to FIG. 2, the first switch circuit 100 includes a first switch T, a first resistor R1, a second resistor R2 and a third resistor R3. The first switch T includes a first switch first terminal, a first switch second terminal, and a first switch third terminal. The first resistor R1 is electrically connected between the first voltage signal and the first switch first terminal. The second resistor R2 is electrically connected between the first switch first terminal and ground. The first switch second terminal is grounded. The first switch third terminal is configured to receive an auxiliary voltage signal via the third resistor R3. The first switch third terminal is configured to output the second voltage signal. In one embodiment, the first switch T is an NPN type transistor. The first switch first terminal is a base. The first switch second terminal is an emitter. The first switch third terminal is a collector. The first voltage signal and the auxiliary voltage signal are about +3.3V.

The charge circuit 200 includes a diode D. An anode of the diode D is electrically connected to the first switch third terminal for receiving the second voltage signal. The delay circuit 300 includes a fourth resistor R4 and a capacitor C. The fourth resistor R4 and the capacitor C are electrically connected in series between the first switch third terminal and ground. A cathode of the diode D is electrically connected to a connection point between the fourth resistor R4 and the capacitor C.

The second switch circuit 400 includes a second switch Q1, a third switch Q2, a fifth resistor R5, and a sixth resistor R6. The second switch Q1 includes a second switch first terminal, a second switch second terminal, and a second switch third terminal. The third switch Q2 includes a third switch first terminal, a third switch second terminal, and a third switch third terminal. The second switch first terminal is electrically connected to a connection point between the fourth resistor R4 and the capacitor C for receiving the second voltage signal. The second switch second terminal is grounded. The second switch third terminal is electrically connected to the third switch first terminal. The second switch third terminal is configured to receive the auxiliary voltage signal via the fifth resistor R5. The third switch second terminal is grounded. The third switch third terminal is configured to output the RSMRST signal. The third switch third terminal is configured to receive the auxiliary voltage signal via the sixth resistor R6. In one embodiment, the second switch Q1 and the third switch Q2 are N-channel MOSFET. The second switch first terminal is a gate. The second switch second terminal is a source. The second switch third terminal is a drain. The third switch first terminal is a gate. The third switch second terminal is a source. The third switch third terminal is a drain.

When the first switch circuit 100 receives a low level voltage first voltage signal, the first switch T turns off. The low level voltage first voltage signal is converted to a high level voltage second voltage signal. The capacitor C of the delay circuit 300 is charged by the high level voltage second voltage signal via the diode D until the second switch Q1 turns on. The second switch first terminal receives a low level voltage from ground. The third switch Q2 turns off. The third switch third terminal outputs a high level voltage RSMRST signal.

When the first switch circuit 100 receives a high level voltage first voltage signal, the first switch T turns on. The fourth resistor R4 and the first switch T. discharge the fully charged capacitor C. The second switch first terminal is pulled down to a low level voltage and turns off. The third switch first terminal receives the high level voltage +3.3V_AUX voltage signal and turns on. The third switch third terminal outputs the low level voltage RSMRST signal. The capacitor C plays a role of time delay during being discharged by the fourth resistor R4 and the first switch T. The RSMRST signal is output after a period of time delayed.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A resume and reset (RSMRST) signal output circuit, for outputting a low level voltage RSMRST signal, comprising:
a first switch circuit configured to receive a first voltage signal and convert the first voltage signal to a second voltage signal;
a delay circuit configured to be charged by the second voltage signal and output the second voltage signal once fully charged; and
a second switch circuit configured to receive the second voltage signal and output the RSMRST signal;
wherein the delay circuit is charged during a first state and discharged during a second state; in the first state, the first switch circuit is configured to receive a low level voltage first voltage signal, the delay circuit is charged by the second voltage signal and the second switch circuit is configured to output a high level voltage RSMRST signal once the delay circuit is fully charged; in the second state, the first switch circuit is configured to receive a high level voltage first voltage signal, the delay circuit is discharged by the first switch circuit and the second switch circuit is configured to output the low level voltage RSMRST signal.

2. The RSMRST signal output circuit of claim 1, wherein the first switch circuit comprises a first switch, a first resistor, a second resistor and a third resistor; the first switch comprises a first switch first terminal, a first switch second terminal, and a first switch third terminal; the first resistor is electrically connected between the first voltage signal and the first switch first terminal; the second resistor is electrically connected between the first switch first terminal and ground; the first switch second terminal is grounded; the first switch third terminal is configured to receive an auxiliary voltage signal via the third resistor; and the first switch third terminal is configured to output the second voltage signal.

3. The RSMRST signal output circuit of claim 2, wherein the first switch is an NPN type transistor; the first switch first terminal is a base; the first switch second terminal is an emitter; and the first switch third terminal is a collector.

4. The RSMRST signal output circuit of claim 2, wherein the first voltage signal and the auxiliary voltage signal are about +3.3V.

5. The RSMRST signal output circuit of claim 4, further comprising a charge circuit; and wherein the delay circuit is configured to be charged by the second voltage signal via the charge circuit.

6. The RSMRST signal output circuit of claim 5, wherein the charge circuit comprises a diode; an anode of the diode is electrically connected to the first switch third terminal for receiving the second voltage signal; the delay circuit comprises a fourth resistor and a capacitor; the fourth resistor and the capacitor are electrically connected in series between the first switch third terminal and ground; and a cathode of the diode is electrically connected to a connection point between the fourth resistor and the capacitor.

7. The RSMRST signal output circuit of claim 6, wherein the second switch circuit comprises a second switch, a third switch, a fifth resistor, and a sixth resistor; the second switch comprises a second switch first terminal, a second switch second terminal, and a second switch third terminal; the third switch comprises a third switch first terminal, a third switch second terminal, and a third switch third terminal; the second switch first terminal is electrically connected to the connection point between the fourth resistor and the capacitor for receiving the second voltage signal; the second switch second terminal is grounded; the second switch third terminal is electrically connected to the third switch first terminal; the second switch third terminal is configured to receive the auxiliary voltage signal via the fifth resistor; the third switch second terminal is grounded; the third switch third terminal is configured to output the RSMRST signal; and the third switch third terminal is configured to receive the auxiliary voltage signal via the sixth resistor.

8. The RSMRST signal output circuit of claim 7, wherein the second switch and the third switch are N-channel MOSFETs; the second switch first terminal is a gate; the second switch second terminal is a source; the second switch third terminal is a drain; the third switch first terminal is a gate; the third switch second terminal is a source; and the third switch third terminal is a drain.

9. A resume and reset (RSMRST) signal output circuit, for outputting a low level voltage RSMRST signal, comprising:
a first switch circuit configured to receive a first voltage signal and convert the first voltage signal to a second voltage signal;
a charge circuit electrically connected to the first switch circuit;
a delay circuit configured to be charged by the second voltage signal via the charge circuit and output the second voltage signal once fully charged; and
a second switch circuit configured to receive the second voltage signal and output the RSMRST signal;
wherein the delay circuit is charged during a first state and discharged during a second state; in the first state, the first switch circuit is configured to receive a low level voltage first voltage signal, the delay circuit is charged by the second voltage signal and the second switch circuit is configured to output a high level voltage RSMRST signal once the delay circuit is fully charged; in the second state, the first switch circuit is configured to receive a high level voltage first voltage signal, the delay circuit is discharged by the first switch circuit and the second switch circuit is configured to output the low level voltage RSMRST signal.

10. The RSMRST signal output circuit of claim 9, wherein the first switch circuit comprises a first switch, a first resistor, a second resistor and a third resistor; the first switch comprises a first switch first terminal, a first switch second terminal, and a first switch third terminal; the first resistor is electrically connected between the first voltage signal and the first switch first terminal; the second resistor is electrically connected between the first switch first terminal and ground; the first switch second terminal is grounded; the first switch third terminal is configured to receive an auxiliary voltage signal via the third resistor; and the first switch third terminal is configured to output the second voltage signal.

11. The RSMRST signal output circuit of claim 10, wherein the first switch is an NPN type transistor; the first switch first terminal is a base; the first switch second terminal is an emitter; and the first switch third terminal is a collector.

12. The RSMRST signal output circuit of claim 10, wherein the first voltage signal and the auxiliary voltage signal are about +3.3V.

13. The RSMRST signal output circuit of claim 12, wherein the charge circuit comprises a diode; an anode of the diode is electrically connected to the first switch third terminal for receiving the second voltage signal; the delay circuit comprises a fourth resistor and a capacitor; the fourth resistor and the capacitor are electrically connected in series between the first switch third terminal and ground; and a cathode of the diode is electrically connected to a connection point between the fourth resistor and the capacitor.

14. The RSMRST signal output circuit of claim 13, wherein the second switch circuit comprises a second switch, a third switch, a fifth resistor, and a sixth resistor; the second switch comprises a second switch first terminal, a second switch second terminal, and a second switch third terminal; the third switch comprises a third switch first terminal, a third switch second terminal, and a third switch third terminal; the second switch first terminal is electrically connected to the connection point between the fourth resistor and the capacitor for receiving the second voltage signal; the second switch second terminal is grounded; the second switch third terminal is electrically connected to the third switch first terminal; the second switch third terminal is configured to receive the auxiliary voltage signal via the fifth resistor; the third switch second terminal is grounded; the third switch third terminal is configured to output the RSMRST signal; and the third switch third terminal is configured to receive the auxiliary voltage signal via the sixth resistor.

15. The RSMRST signal output circuit of claim 14, wherein the second switch and the third switch are N-channel MOSFETs; the second switch first terminal is a gate; the second switch second terminal is a source; the second switch third terminal is a drain; the third switch first terminal is a gate; the third switch second terminal is a source; and the third switch third terminal is a drain.

* * * * *

UNITED STATES PATENT AND TRADEMARK OFFICE
CERTIFICATE OF CORRECTION

| | |
|---|---|
| PATENT NO. | : 8,283,954 B2 |
| APPLICATION NO. | : 13/095865 |
| DATED | : October 9, 2012 |
| INVENTOR(S) | : Hong-Wen Chao, San-Yuan Chuang and Mao-Shun Hsi |

It is certified that error appears in the above-identified patent and that said Letters Patent is hereby corrected as shown below:

Title Page, below Item (22) insert:

-- (30)   Foreign Application Priority Data

Oct. 19, 2010   (TW) ..........................099135523 --.

Signed and Sealed this
Fifth Day of November, 2013

Teresa Stanek Rea
*Deputy Director of the United States Patent and Trademark Office*